United States Patent
Basker et al.

(10) Patent No.: US 9,543,435 B1
(45) Date of Patent: Jan. 10, 2017

(54) ASYMMETRIC MULTI-GATE FINFET

(71) Applicant: International Business Machines Corporation, Armonk, NY (US)

(72) Inventors: Veeraraghavan S. Basker, Schenectady, NY (US); Andres Bryant, Burlington, VT (US); Huiming Bu, Millwood, NY (US); Sivananda K. Kanakasabapathy, Niskayuna, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/887,384

(22) Filed: Oct. 20, 2015

(51) Int. Cl.
| | |
|---|---|
| *H01L 29/735* | (2006.01) |
| *H01L 29/78* | (2006.01) |
| *H01L 29/66* | (2006.01) |
| *H01L 29/423* | (2006.01) |
| *H01L 29/417* | (2006.01) |

(52) U.S. Cl.
CPC ..... *H01L 29/7835* (2013.01); *H01L 29/41791* (2013.01); *H01L 29/42392* (2013.01); *H01L 29/6656* (2013.01); *H01L 29/66545* (2013.01); *H01L 29/66659* (2013.01); *H01L 29/66795* (2013.01); *H01L 29/785* (2013.01); *H01L 2029/7858* (2013.01)

(58) Field of Classification Search
CPC ........... H01L 29/7835; H01L 29/42392; H01L 29/41791; H01L 29/6656; H01L 29/785; H01L 29/66795; H01L 29/6645; H01L 29/66659

See application file for complete search history.

(56) References Cited

U.S. PATENT DOCUMENTS

| | | | |
|---|---|---|---|
| 6,344,396 B1 | 2/2002 | Ishida et al. | |
| 6,794,256 B1 | 9/2004 | Fuselier et al. | |
| 7,772,048 B2 * | 8/2010 | Jones | ...................... H01L 21/84 257/E21.205 |
| 7,863,136 B2 | 1/2011 | Goldbach et al. | |
| 8,618,616 B2 | 12/2013 | Pham | |

(Continued)

OTHER PUBLICATIONS

Basker et al., "Asymmetric Multi-Gate Finfet", U.S. Appl. No. 14/949,964, filed Nov. 24, 2015.

(Continued)

*Primary Examiner* — William Coleman
(74) *Attorney, Agent, or Firm* — Cantor Colburn LLP; Vazken Alexanian (57) ABSTRACT

An asymmetrical finFET device includes at least one semiconductor fin on an upper surface of a semiconductor substrate. The fin extends along a length of the semiconductor substrate to define a fin length. A plurality of gate structures wrap around the sidewalls and upper fin surface of the fin. The plurality of gate structures includes at least one desired gate structure surrounded by at least one sacrificial gate structure. A first source/drain region is formed adjacent a first sidewall of the at least one desired gate structure, and a second source/drain region is formed adjacent a second sidewall of the at least one desired gate structure opposite the first sidewall. The dimensions of the first and second source/drain regions are asymmetrical with respect to one another.

3 Claims, 11 Drawing Sheets

(56) References Cited

U.S. PATENT DOCUMENTS

| | | |
|---|---|---|
| 9,184,169 B2* | 11/2015 | Kim .................. H01L 27/1104 |
| 2006/0228850 A1 | 10/2006 | Tsai et al. |
| 2009/0197383 A1* | 8/2009 | Kim ................ H01L 21/28123 |
| | | 438/305 |
| 2011/0108930 A1 | 5/2011 | Cheng et al. |
| 2012/0223386 A1 | 9/2012 | Cheng et al. |
| 2015/0021689 A1 | 1/2015 | Basker et al. |

OTHER PUBLICATIONS

List of IBM Patents or Patent Applications Treated as Related; (Appendix P), Filed Feb. 3, 2016; 2 pages.

Goel et al., "Asymmetric drain spacer extension (ADSE) FinFETs for low-power and robust SRAMs,", IEEE Transactions on Electron Devices, vol. 58, No. 2, 2011, pp. 296-308.

Shiho et al., "Moderately doped channel multiple-FinFET for logic applications." IEEE International Electron Devices Meeting, IEDM, 2005, pp. 976-979.

\* cited by examiner

ASYMMETRIC MULTI-GATE FINFET

BACKGROUND

The present invention relates to semiconductor devices, and more specifically, to fin-type field effect transistor (FET) devices.

As the desire to reduce semiconductor scaling continues, planar-type semiconductor devices have been replaced with fin-type semiconductor devices, which are typically referred to as fin-type field effect transistor devices, or "finFETs." Unlike planar-type FETs which include a gate that contacts only an upper surface of the channel, FinFET devices include one or more gates that wrap around the sidewalls and upper surface of the channel region. The increased gate-contact area improves electrical control over the channel region thereby overcoming various short-channel effects such as reducing leakage current, for example.

FinFET devices, however, are susceptible to high parasitic effects compared to conventional planar FETs. For instance, the source region and drain region of the finFET typically generate a different parasitic resistance and/or a different parasitic capacitance with respect to one another. Conventional solutions have attempted to compensate for variations in parasitic resistance and/or parasitic capacitance by adjusting the dimensions of the drain region with respect to the source region. These variations in source/drain dimensions have conventionally been achieved by implementing additional masking techniques in the finFET fabrication process flow. For example, additional masks are typically employed in the fabrication process flow to block source side when forming drain junction or vice versa. However, as the scaling of finFET devices and the pitch between gate structures continue to decrease, conventional masking techniques no longer effectively form the source/drain regions.

SUMMARY

According to at least one embodiment, an asymmetrical finFET device includes at least one semiconductor fin on an upper surface of a semiconductor substrate. The fin extends along a length of the semiconductor substrate to define a fin length. A plurality of gate structures wrap around the sidewalls and upper fin surface of the fin. The plurality of gate structures includes at least one desired gate structure surrounded by at least one sacrificial gate structure. A first source/drain region is formed adjacent a first sidewall of the at least one desired gate structure, and a second source/drain region is formed adjacent a second sidewall of the at least one desired gate structure opposite the first sidewall. The dimensions of the first and second source/drain regions are asymmetrical with respect to one another.

According to another embodiment, a method of fabricating an asymmetrical semiconductor device comprises forming at least one semiconductor fin on an upper surface of a semiconductor substrate. The at least one fin extends along a length of the semiconductor substrate to define a fin length and has a first fin area reserved for a first source/drain region and a second fin area reserved for a second source/drain region opposite the second fin area. The method further includes forming, on the upper surface of the semiconductor substrate, a plurality of gate structures that wrap around the sidewalls and upper fin surface of the at least one semiconductor fin. The plurality of gate structures includes at least one desired gate structure surrounded by at least one sacrificial gate structure. The method further includes selectively removing the at least one sacrificial gate structure so as to increase the first fin area with respect to the second fin area, and forming asymmetrical gate spacers on opposing sidewalls of the desired gate structure. The method further includes implanting dopants in the first and second fin areas, wherein the asymmetrical gate spacers control a lateral diffusion of the dopants along the fin length so as to form asymmetrical first and second source/drain regions.

According to yet another embodiment, a method of fabricating an asymmetrical finFET device comprises forming, on an upper surface of a semiconductor substrate, at least one semiconductor fin that has a first fin area reserved for a first source/drain region and a second fin area reserved for a second source/drain region opposite the second fin area. The at least one semiconductor fin extends along a length of the semiconductor substrate to define a fin length. The method further includes forming at least one desired gate structure that wraps around the sidewalls and an upper fin surface of the at least one semiconductor fin. The method further includes forming a plurality of sacrificial gate structures that wrap around the sidewalls and upper fin surface of the at least one semiconductor fin. The plurality of sacrificial gate structures surrounds the at least one desired gate structure. The method further includes selectively removing at least one sacrificial gate structure so as to increase the first fin area with respect to the second fin area, and depositing a conformal spacer layer on an upper surface of the at least one fin so as to cover the first and second fin areas and the desired gate structure. The method further includes performing an etching process that etches the conformal spacer layer deposited in the increased first fin area at a slower rate than the conformal spacer layer deposited in the second fin area so as to form asymmetrical gate spacers on opposing sidewalls of the desired gate structure. The method further includes implanting dopants in the increased first fin area and the second fin area, wherein the asymmetrical gate spacers control a lateral diffusion of the dopants along the fin length so as to form asymmetrical first and second source/drain regions.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

FIGS. 1A-10 are a series of views illustrating a method of forming an asymmetrical finFET device according to exemplary embodiments of the present teachings, in which:

DETAILED DESCRIPTION

Various embodiments of the invention provide an asymmetrical finFET device including source/drain region having different dimensions with respect to one another. For instance, the drain region of conventional finFET devices typically generates a greater parasitic capacitance compared to the source region. Therefore, at least one embodiment of the invention provides an asymmetrical finFET device that compensates for increased parasitic capacitance and/or increased parasitic resistance by reducing the overlap of the drain region with respect to the source region. In this manner, the parasitic resistance and/or parasitic capacitance of the drain region and the source region can be balanced, or substantially matched, with respect to one another.

According to another embodiment, multiple gate structures are formed on a semiconductor wafer and wrap around a channel region of one or more semiconductor fins. Among the gate structures, a desired gate structure is surrounded by a plurality of sacrificial gate structures. The desired gate structure is interposed between exposed regions of the semiconductor fins. These exposed regions are reserved for drain region and the source region corresponding to the desired gate structure. At least one embodiment of the invention includes cutting away one or more of the sacrificial gates to increase the area reserved for a drain region.

The increased area of the intended drain region varies the loading effect of plasma reactive ion etch (RIE) process, for example, which can be used to form gate spacers on the sidewalls of the desired gate stack. The varied loading effect caused by the increased drain region creates a thick spacer at the reserved drain region and a thin spacer at the reserved source region. When forming the source/drain regions of the finFET device, the thick spacer formed over the reserved drain can be used to limit the distance at which dopants implanted extend beneath the gate spacer, or even can completely prevent the dopants from extending beneath the gate spacer. Accordingly, an asymmetrical finFET device can be formed. Unlike conventional fabrication methods, however, at least one embodiment achieves a variation in the drain region overlap with respect to the source region without requiring additional masks. In this manner, a reduced scaled asymmetrical finFET device is provided having an adjusted parasitic resistance and/or parasitic capacitance between drain region and the source region.

Figure 1A:
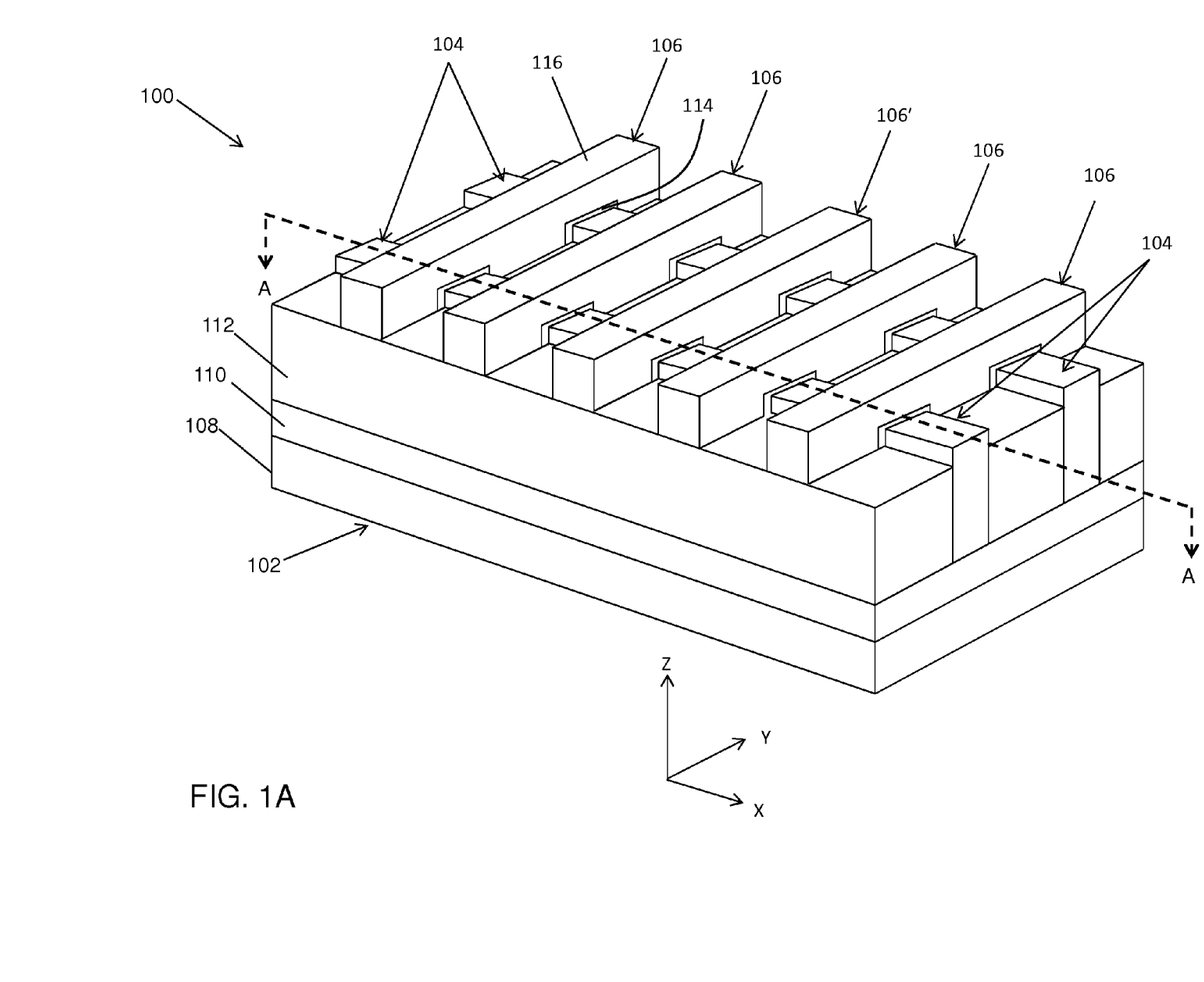
FIG. 1A is a perspective view illustrating an intermediate finFET device including a plurality of gates formed atop a semiconductor wafer and wrapping around the outer surface of a plurality of semiconductor fins.
Figure 1B:
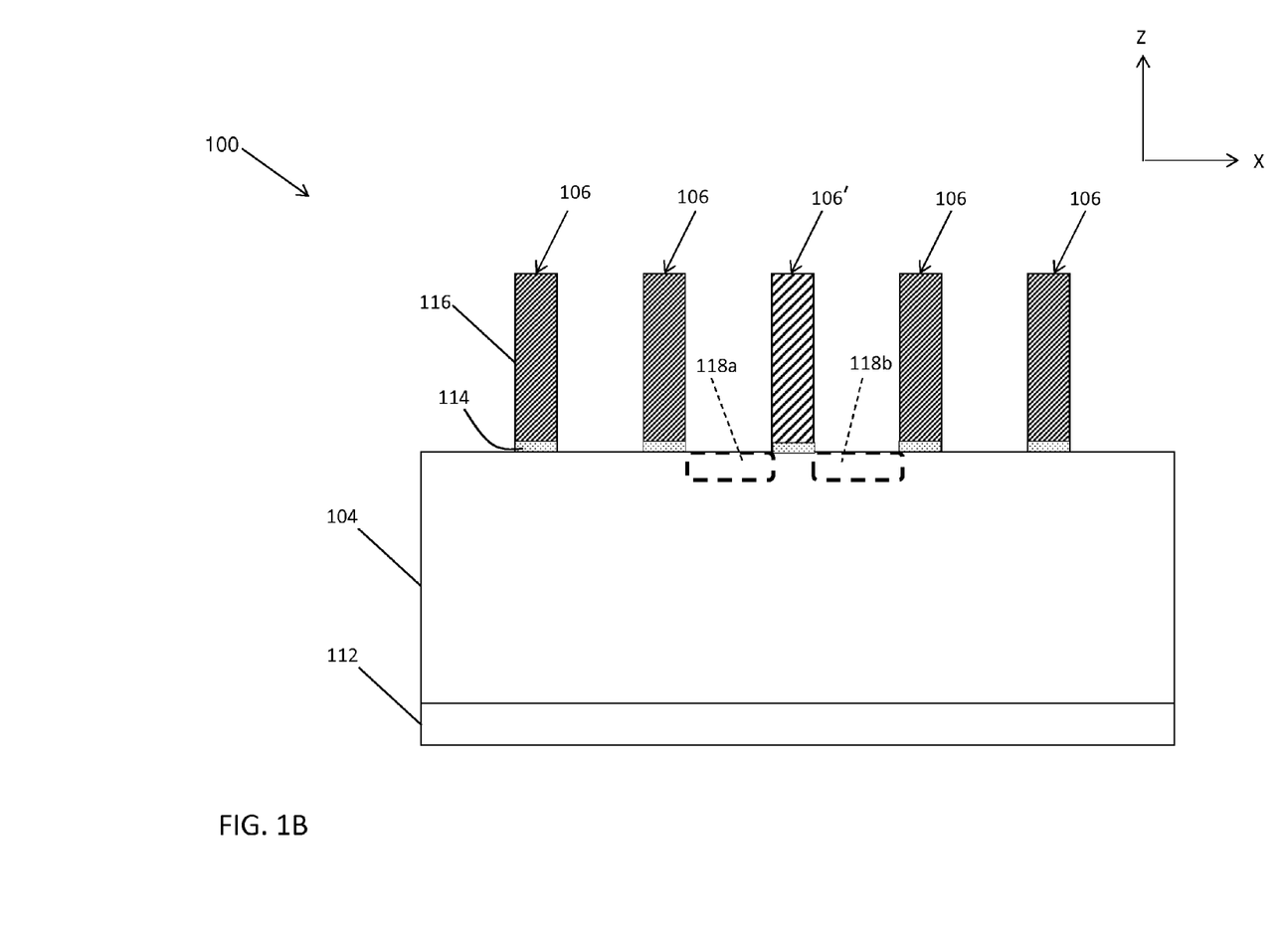
FIG. 1B is a cross-sectional view taken along line A-A of the semiconductor device illustrated in FIG. 1A showing the desired gate interposed between a pair of intended source/drain regions.

With reference now to FIGS. 1A-1B, an intermediate semiconductor structure 100 is illustrated which serves as a starting point for fabricating an asymmetrical finFET device (not shown in FIGS. 1A-1B) in accordance with an exemplary embodiment. In the present specification and claims, an "intermediate" semiconductor device is defined as a semiconductor device in a stage of fabrication prior to a final stage. In exemplary embodiments, the semiconductor structure 100 includes a semiconductor substrate 102, one or more semiconductor fins 104, and a plurality of gate structures 106.

The semiconductor substrate 102 extends along a first axis (e.g., X-axis) to define a length, a second axis (e.g., Y-axis) to define a width, and a third axis (e.g., Z-axis) to define a height. According to a non-limiting embodiment, the semiconductor substrate 102 is a semiconductor-on-insulator (SOI) substrate 102 including a bulk substrate layer 108, a buried insulator layer 110 disposed on an upper surface of the bulk substrate layer 108, and an active semiconductor layer 112 formed on an upper surface of the bulk substrate layer 108. The bulk semiconductor layer 108 is formed from, silicon (Si), for example, the buried insulator layer is formed from silicon dioxide ($SiO_2$), for example, and the active semiconductor layer 112 is formed from, for example, Si. Although an SOI substrate 102 is described going forward, it should be appreciated that a bulk substrate may be utilized without changing the scope of the invention. In this case, the bulk substrate is formed from various semiconductor materials such as Si, for example, and may include one or more shallow trench isolation (STI) regions as understood by one of ordinary skill in the art.

The fins 104 are patterned from the active semiconductor layer 112 using any suitable technique known in the art. For example, the fins 104 may be formed from the active semiconductor layer 112 by a sidewall image transfer (SIT) process such that the fins 104 are formed of the same material as the active semiconductor layer 112 (e.g., Si).

In the case where a bulk substrate is used, for example, a suitable hardmask blocking layer (not shown) formed of silicon dioxide ($SiO_2$), for example, can be initially deposited on an upper surface of the bulk substrate (not shown). Next, a suitable hardmask cap layer (not shown) formed of silicon nitride (SiN), for example, is deposited atop the hardmask blocking layer. The hardmask cap layer and the hardmask blocking layer will be used to pattern the underlying bulk substrate 202. In addition, the hardmask cap layer and the hardmask blocking layer may serve to protect the fin 104 during the formation of one or more isolation regions (not shown) as understood by one of ordinary skill in the art.

Next, the hardmask blocking layer and the hardmask cap layer are etched to define the desired fin pattern. A developed photoresist mask (not shown) is typically used to define the desired fin pattern. The hardmask blocking layer and hardmask cap layer can then be patterned selective to the developed photoresist mask according to a reactive ion etch (RIE) process. The patterned hardmask layers is then used to transfer the desired fin pattern into the underlying bulk substrate layer 202 according to a RIE process to define the semiconductor fin 104. It should be appreciated that the length and width of the patterning can be determined according to the desired fin dimensions for the particular application.

The fins 104 have a length (e.g., extending along the X-axis) ranging from approximately 10 nm to approximately 200 nm, a width (e.g., extending along a Y-axis) ranging from approximately 4 nm to approximately 15 nm, and a height (e.g., extending along the Z-axis) ranging from approximately 25 nm to approximately 60 nm. In addition, the fins 104 have a pitch ranging from approximately 10 nm to approximately 50 nm.

The gate structures 106 are formed atop the active semiconductor layer 112 and wrap around sidewalls and upper surface of the fin channel regions. According to a non-limiting embodiment, the gate structures 106 are formed according to a gate-last process. The gate-last process includes depositing a gate dielectric material 114 on sidewalls and an upper surface of the fin channel regions using conventional deposition methods such as, for example, CVD. The dielectric material 114 can be an oxide material, e.g., $SiO_2$. A gate material 116 such as a polysilicon material 116, for example, is then formed atop the dielectric material 114, using an atomic layer deposition (ALD) process, for example. The dielectric material 114 and the polysilicon material 116 can then be patterned using various lithography and etching processes to form the gate structures 106 illustrated in FIGS. 1A-1B.

According to another embodiment, the gate structures 106 can be formed according to a gate-first process. In this case, the gate dielectric material 114 is a high-k material such as, for example, a hafnium oxide ($HfO_2$). The thickness of the gate dielectric material 114 can vary depending on the required device performance. The gate material 116 can be any gate metal such as, for example, aluminum (Al) lined with a workfunction metal (not shown) including, but not limited to, titanium nitride (TiN) or tantalum nitride (TaN).

In either embodiment described above, the gate structures 106 have a length (e.g., extending along the X-axis) ranging from approximately 10 nm to approximately 35 nm, a width (e.g., extending along a Y-axis) ranging from approximately 100 nm to approximately 500 nm, and a height (e.g., extending along the Z-axis) ranging from approximately 50 nm to approximately 150 nm. In addition, the gate structures 106 have a pitch ranging from approximately 30 nm to approximately 80 nm. Due to the reduced pitch of the gate structures 106, at least one embodiment of the invention omits conventional masking techniques when forming source/drain regions of the asymmetrical finFET device as discussed in greater detail below.

As further illustrated in FIG. 1B, the gate structures 106 include one or more desired gate structures 106' surrounded by a plurality of sacrificial gate structures 106. The desired gate structure 106' is formed between areas of the semiconductor fin 104 reserved for the formation of a source region and a drain region at a subsequent step of the process flow described in further detail below. At this stage of the process flow, however, the reserved areas are referred to as a reserved drain region 118a and a reserved source region 118b, respectively, as shown in FIG. 1B.

Figure 2:
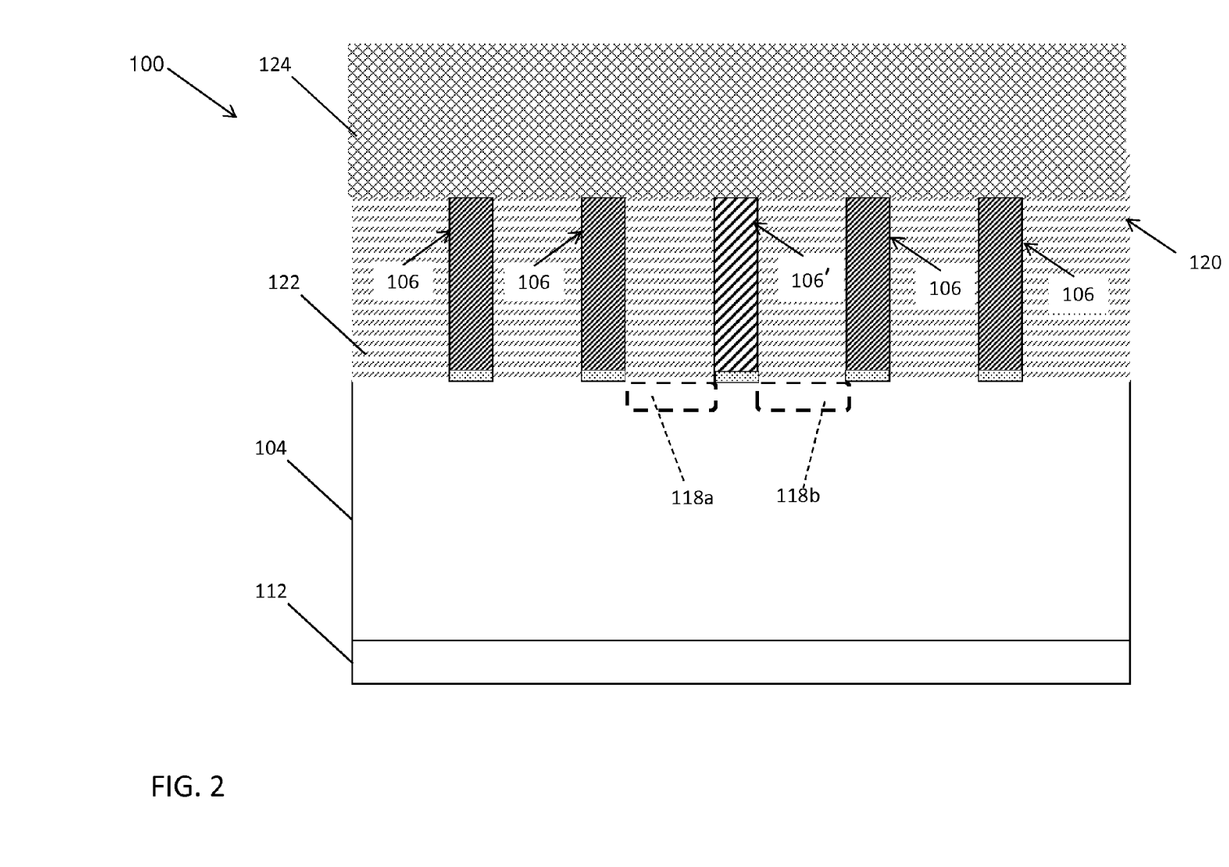
FIG. 2 illustrates the semiconductor device of FIGS. 1A-1B following formation of a sidewall image transfer (SIT) patterning stack atop the substrate to cover the fins and the gate structures.

Turning now to FIG. 2, a sidewall image transfer (SIT) patterning stack (120) is formed on an upper surface of the buried insulator layer 104 and covers the fins 104 and the gate structures 106-106'. The SIT patterning stack 120 includes a transfer layer 122 and a mandrel layer 124. The transfer layer 122 is deposited atop the buried insulator layer and extends at a height which encapsulates the fins 104 and the gate structures 106-106'. According to an exemplary embodiment, the transfer layer 106 is formed from a nitride material, such as silicon nitride (SiN) for example, which is deposited using a method such as chemical vapor deposition (CVD). It may be desirable to planarize the transfer layer 122 using a method such as chemical-mechanical planarization (CMP) to provide a flat surface on which to form the mandrel layer 124. The mandrel layer 124 is formed on the upper surface of the transfer layer 122. According to an exemplary embodiment, the mandrel layer 124 is formed from amorphous silicon, for example, which is deposited using various deposition processes including, but not limited to, a chemical vapor deposition (CVD) process.

Figure 3:
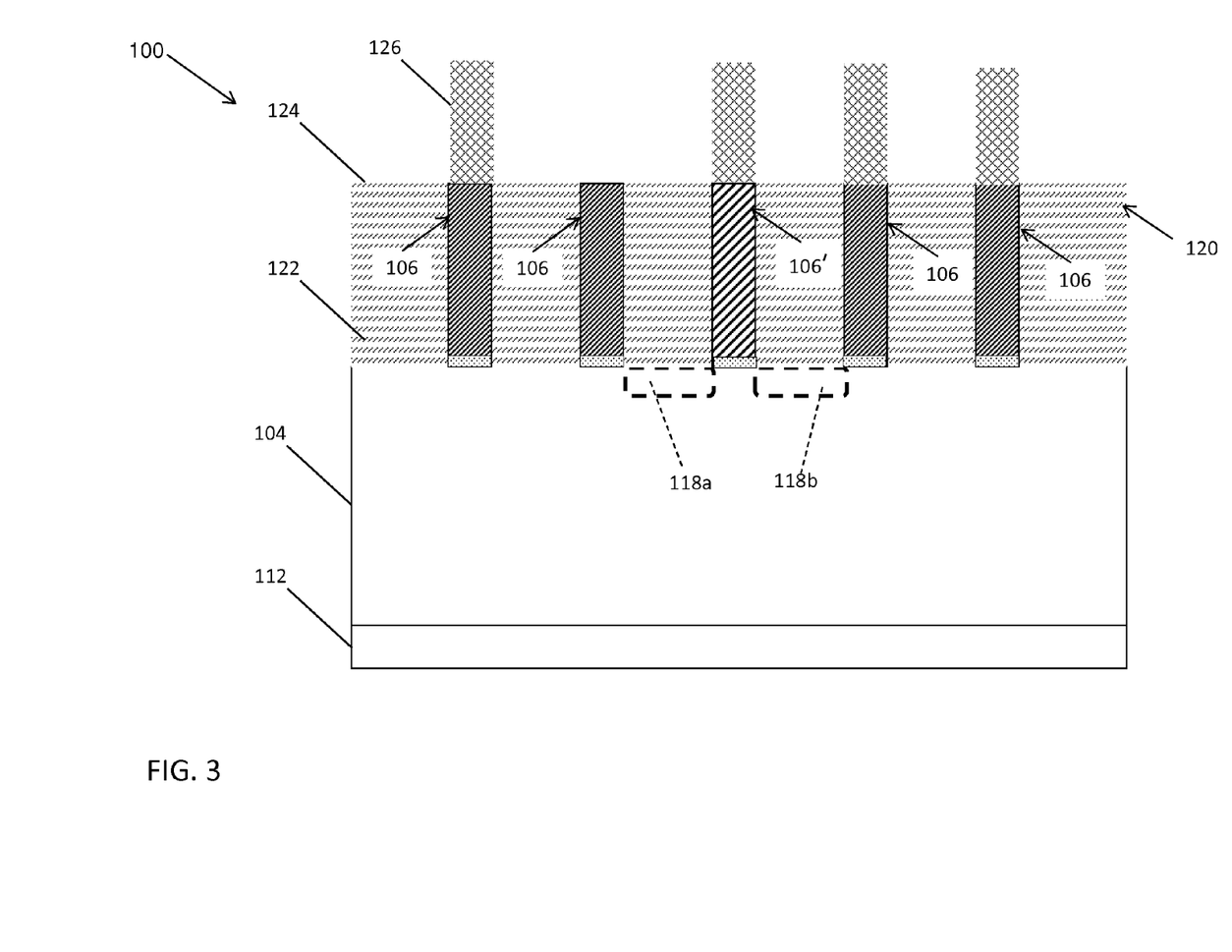
FIG. 3 illustrates the semiconductor device of FIG. 2 after patterning the SIT patterning stack to form a plurality mandrels for preserving one or more selected gate structures.

Turning to FIG. 3, the semiconductor device 100 is illustrated following a patterning process that forms mandrels 126 atop the gate stacks 106-106' selected for preservation. The mandrel layer 124 is patterned according to various lithography and etching techniques. This mandrel patterning process may include forming a mask (not shown) on the mandrel layer 108. The mask includes a footprint identifying the desired location of the mandrels 126 with respect to the gate structures 106-106' selected for preservation.

Figure 4:
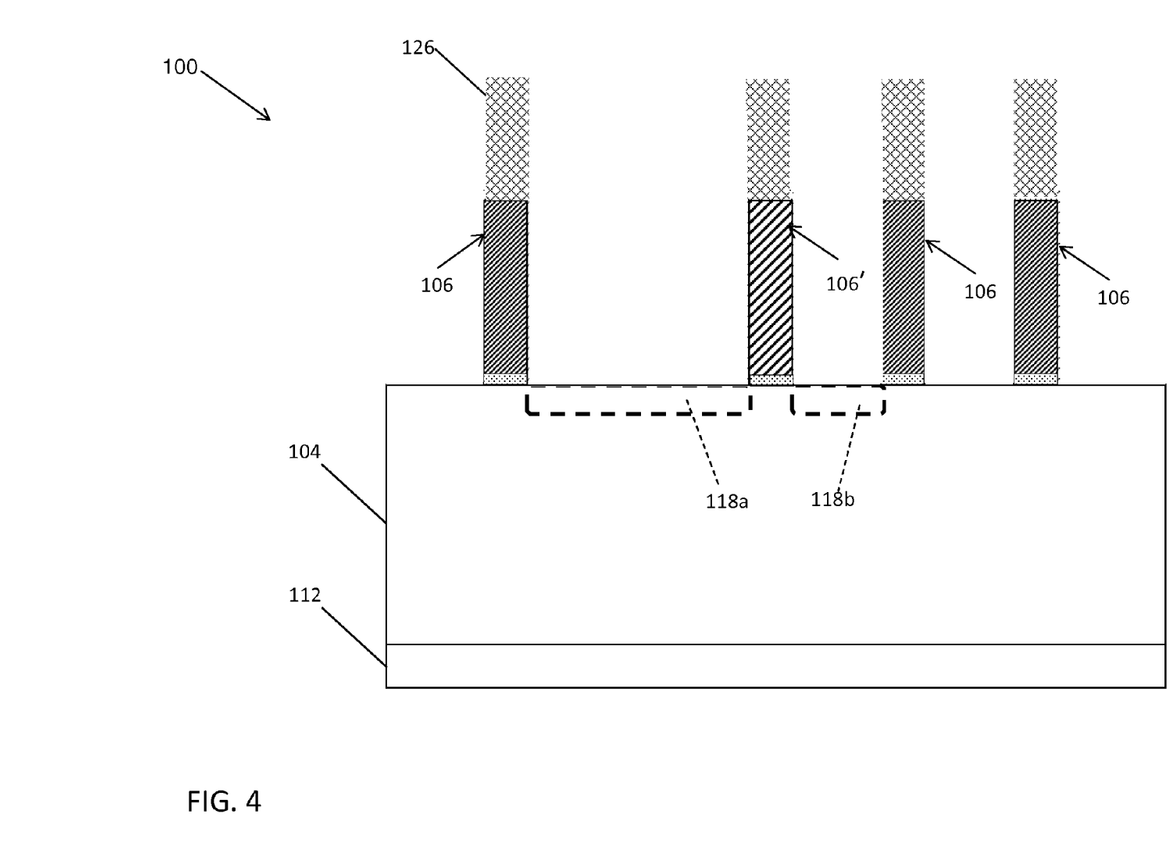
FIG. 4 illustrates the semiconductor device of FIG. 3 following an etching process selective to the fins so as to remove the SIT patterning stack and the uncovered gate structures.

Referring to FIG. 4, the semiconductor device 100 is illustrated following a directional etch, such as reactive ion etching (RIE), that is selective to the material of the fin 104 and the mandrels 126. In this manner, the pattern defined by the mandrels 126 is transferred through the transfer layer 122 while RIE stops on an upper surface of the fins 104. Since the RIE is selective to the mandrel material, the mandrels 126 preserve the gate structures 106-106', while the un-covered transfer layer and any uncovered sacrificial gate structures are removed (i.e., cut away) from the upper surface of the buried insulator layer 112 (between the fins 104) and the surfaces of the fins 104.

As further illustrated in FIG. 4, removing the uncovered sacrificial gate structure from the reserved drain region 118a increases the distance between the desired gate structure 106' and the next closes sacrificial gate structure 106 located at the reserved drain-side. Therefore, the area of the reserved desired drain region 118a is increased.

Figure 5:
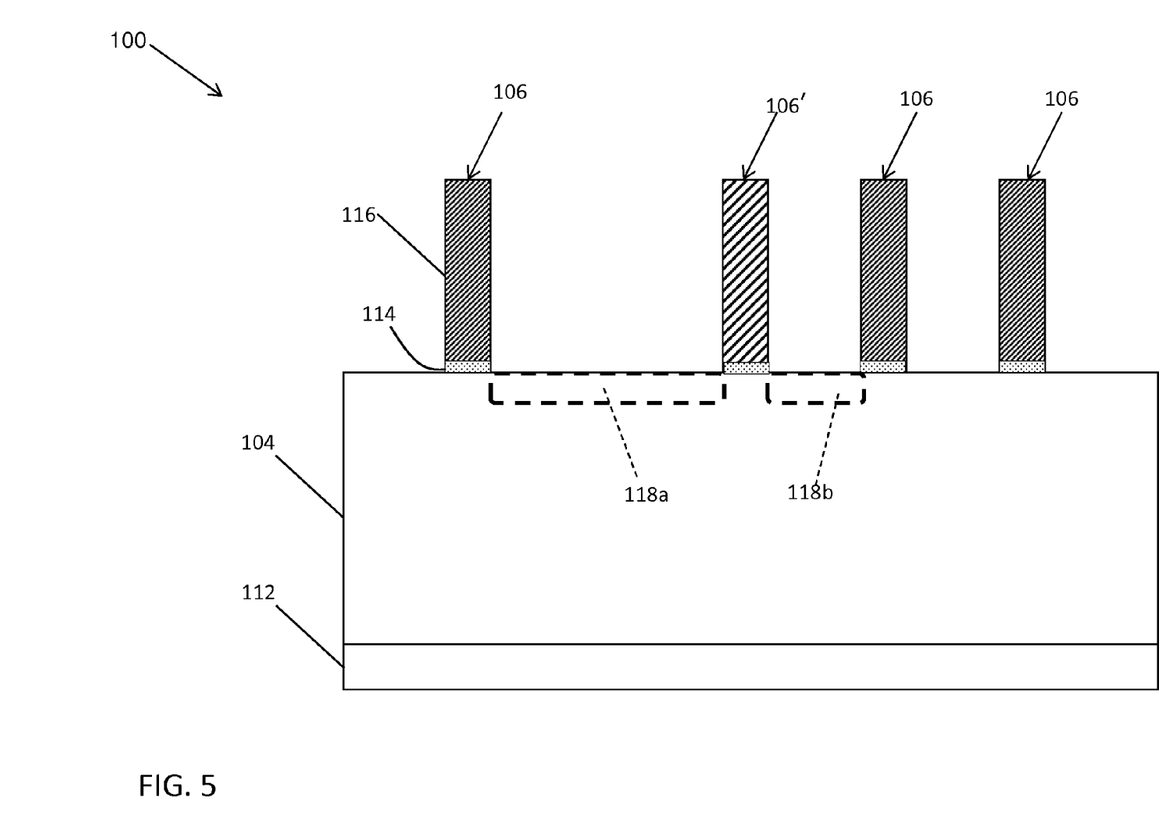
FIG. 5 illustrates the semiconductor device of FIG. 4 after removing the mandrels from atop the remaining gate structures.

Turning now to FIG. 5, the semiconductor device 100 is shown following the removal of the mandrels from atop the preserved gate structures 106-106'. In this case, for example, the removal of the uncovered sacrificial gate structure 106 increases the area of the reserved drain region 118a with respect to the reserved source region 118b. Although a single uncovered sacrificial fin is shown as being removed, it should be appreciated that a plurality of sacrificial gate structures 106 can be removed to adjust the area of the reserved drain region and/or the reserved source regions 118a-118b with respect to one another. Differences in the area of the reserved drain region 118a and reserved source region 118b cause loading effect variations when performing a gate spacer etching process. In this manner, asymmetrical gate spacers (not shown in FIG. 5) can be formed on sidewalls of the desired gate structure 106' as discussed in greater detail below.

Figure 6:
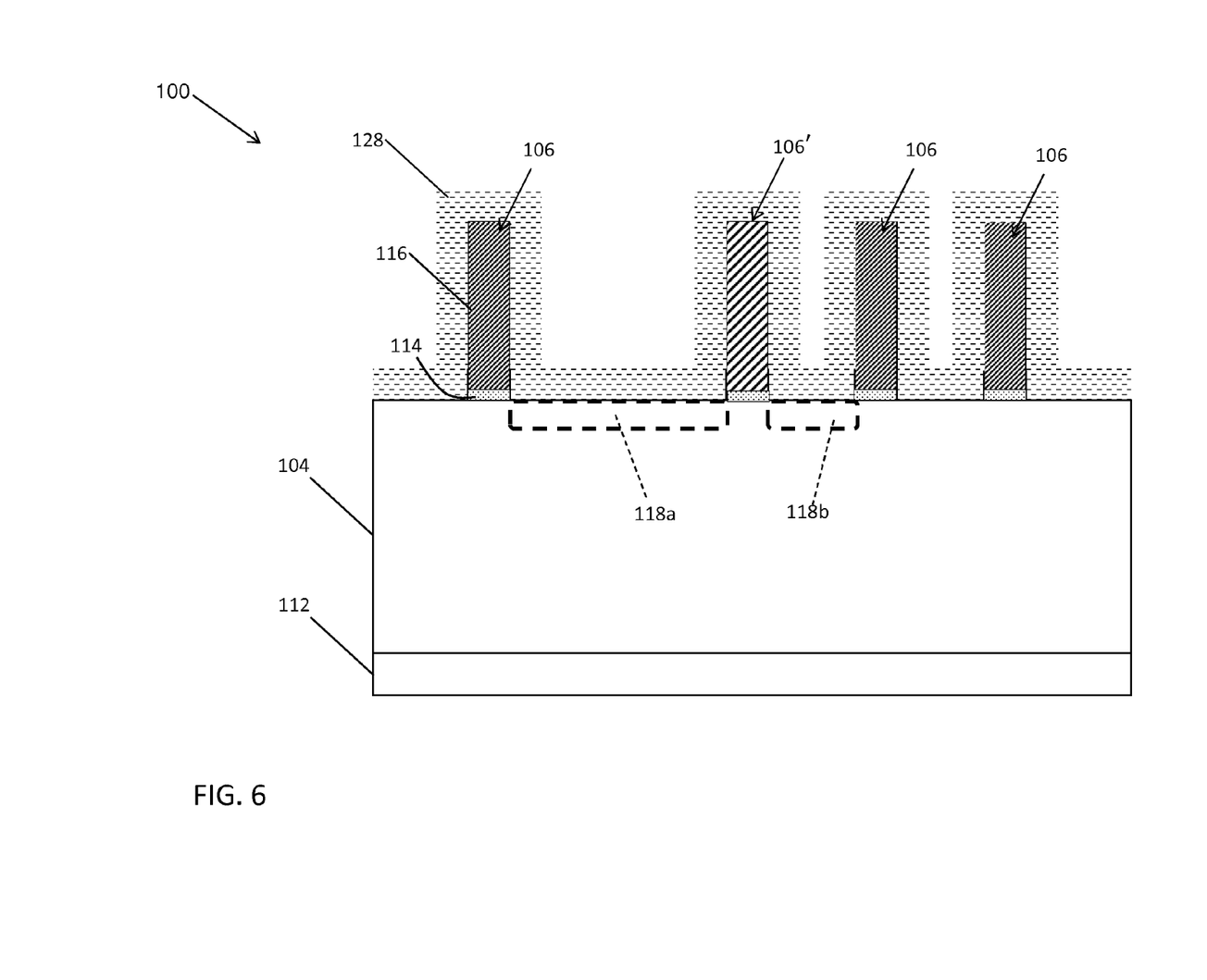
FIG. 6 illustrates the semiconductor device of FIG. 5 after depositing a conformal spacer layer on an upper surface of the fins to cover the sidewalls and upper surface of the sacrificial gates and the desired gate.

Referring to FIG. 6, a conformal sidewall layer 128 is deposited on sidewalls and an upper surface of the gate structures 106-106' and portions of the fins 104 located between the gate structures 106-106'. The conformal sidewall layer 128 is formed of a nitride material, such as SiN, SiOCN or SiBCN for example, and has a thickness ranging from approximately 4 nm to approximately 20 nm; although other dimensions are contemplated. Various techniques for depositing the conformal sidewall layer 128 may be performed including, but not limited to, CVD or ALD process.

Figure 7:
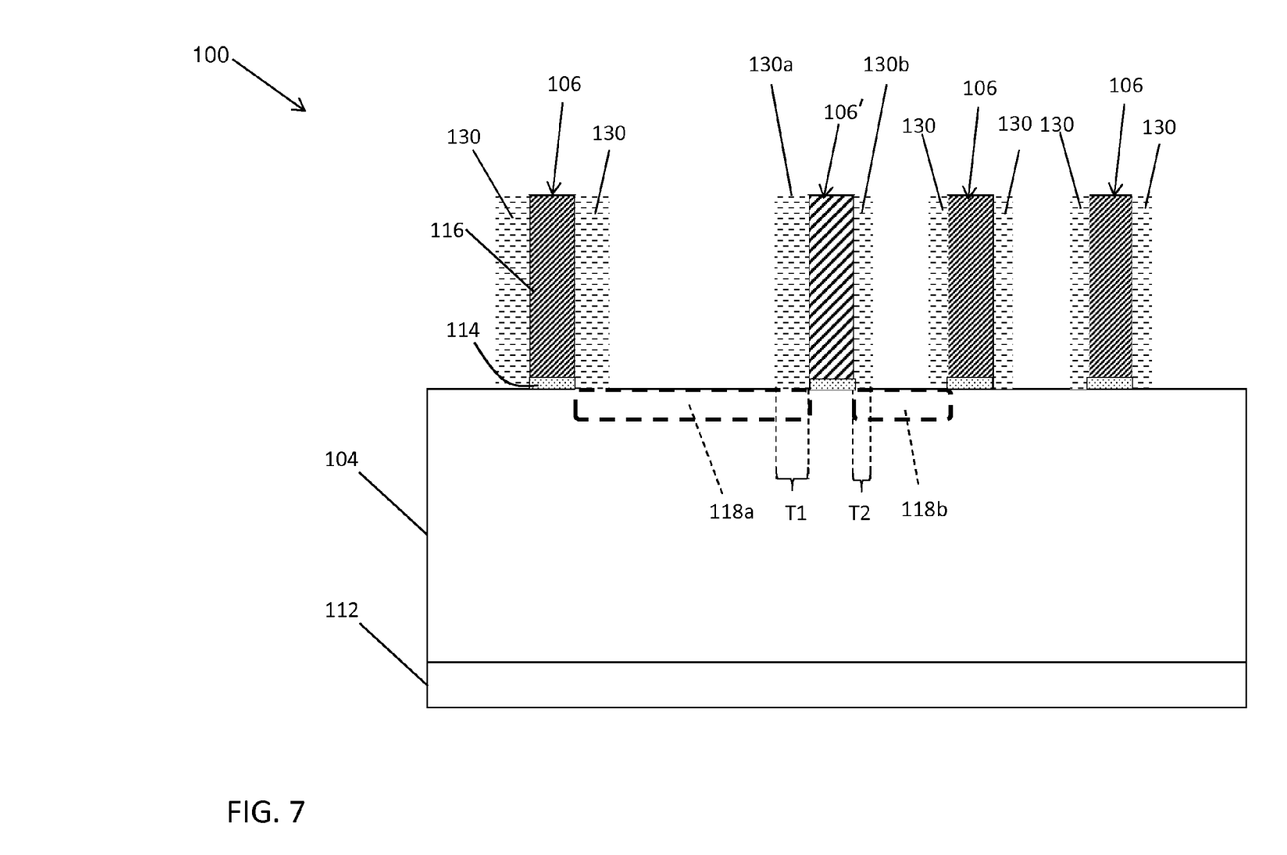
FIG. 7 illustrates the semiconductor device of FIG. 6 following an etching process that forms a first gate spacer having a first thickness on a first sidewall of the desired gate and a second gate spacer having a second thickness different from the first thickness on an opposite sidewall of the desired gate structure.

Turning to FIG. 7, the semiconductor device 100 is illustrated following a spacer etch process. The spacers etch process includes a plasma RIE process, for example, which removes the spacer layer material from the surfaces of the fins 104 and an upper surface of the gates structures 106-106'. Accordingly, gate spacers 130 are formed on opposing sidewalls of the gate structures 106-106'.

As understood by one of ordinary skill in the art, plasma RIE processes are susceptible to loading effects which vary the etch rate at which material is removed. For instance, the etch rate is lower at areas with a greater quantity of target material compared to the etch rate at areas with a lesser quantity of target material. In this example, the quantity of target material (e.g., the spacer layer material indicated as numeral 128 in FIG. 6) previously covering the reserved drain region 118a and the gate structure sidewall adjacent the reserved drain region 118a is greater than the quantity of spacer layer material previously covering the reserved source region 118b and the gate structure sidewall adjacent the reserved source region 118b. Accordingly, the etch rate in the vicinity of the reserved drain region 118a is lower than the etch rate in the vicinity of the reserved source region 118b. In this manner, a pair of asymmetrical gate spacer 130a-130b is formed on opposing sidewalls of the desired gate structure 106'. According to a non-limiting embodiment, a first gate spacer 130a (i.e., drain region gate spacer 130a) located adjacent the reserved drain region 118a has a first thickness $T_1$ and a second gate spacer 130b (i.e., source region gate spacer 130b) located adjacent the reserved source region 118b has a second thickness $T_2$ that is less than $T_1$. The drain region gate spacer 130a may have thickness ranging from approximately 1 nm to 15 nm, while the source region spacer 130b has a thickness ranging from approximately 0.5 nm to approximately 10 nm.

Figure 8:
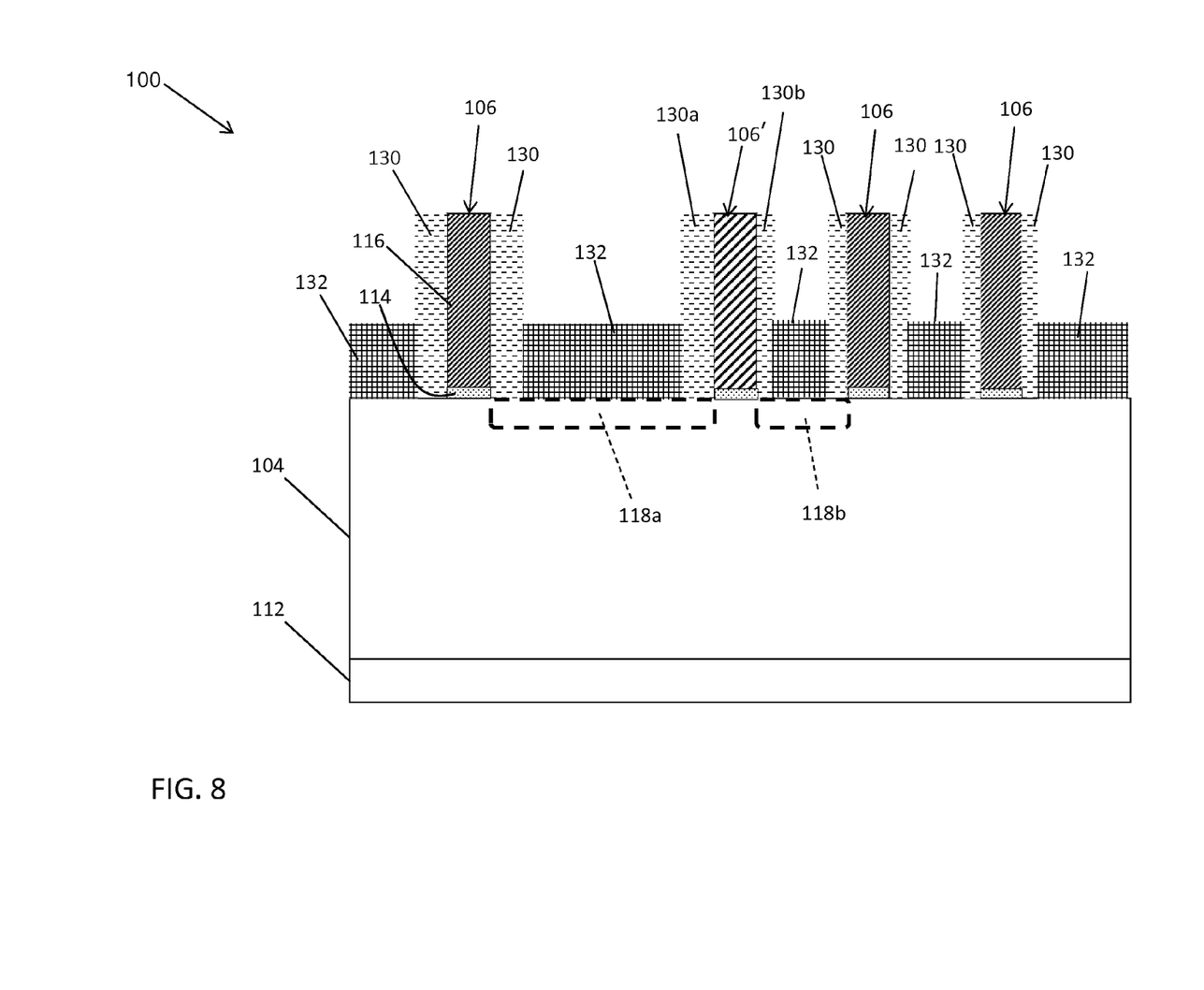
FIG. 8 illustrates the semiconductor device of FIG. 7 after growing a doped epitaxial semiconductor material from exposed surfaces of the semiconductor fins to cover the intended source/drain regions.

Referring to FIG. 8, the semiconductor device 100 is illustrated following an epitaxial growth process to grow a semiconductor material 132 from the exposed surfaces of the semiconductor fins 104 so as to cover the desired drain region 118a and the desired source region 118b. Various epitaxy processes may be used to grow an in-situ doped conductive epitaxial material 132, such as Si or SiGe, on sidewalls and upper surfaces of the semiconductor fins 104. The epitaxy processes include, but are not limited to, vapor phase epitaxy (VPE), molecular beam epitaxy (MBE) or liquid phase epitaxy (LPE) with a gaseous or liquid precursor, such as, for example, silicon tetrachloride. The epitaxy process may include an in-situ doping of the epitaxy material 132 with an impurity such as boron (B), arsenic (As), or phosphorus (P), for example, so as to grow a highly conductive semiconductor material 132 from the surface of the semiconductor fins 104.

Figure 9:
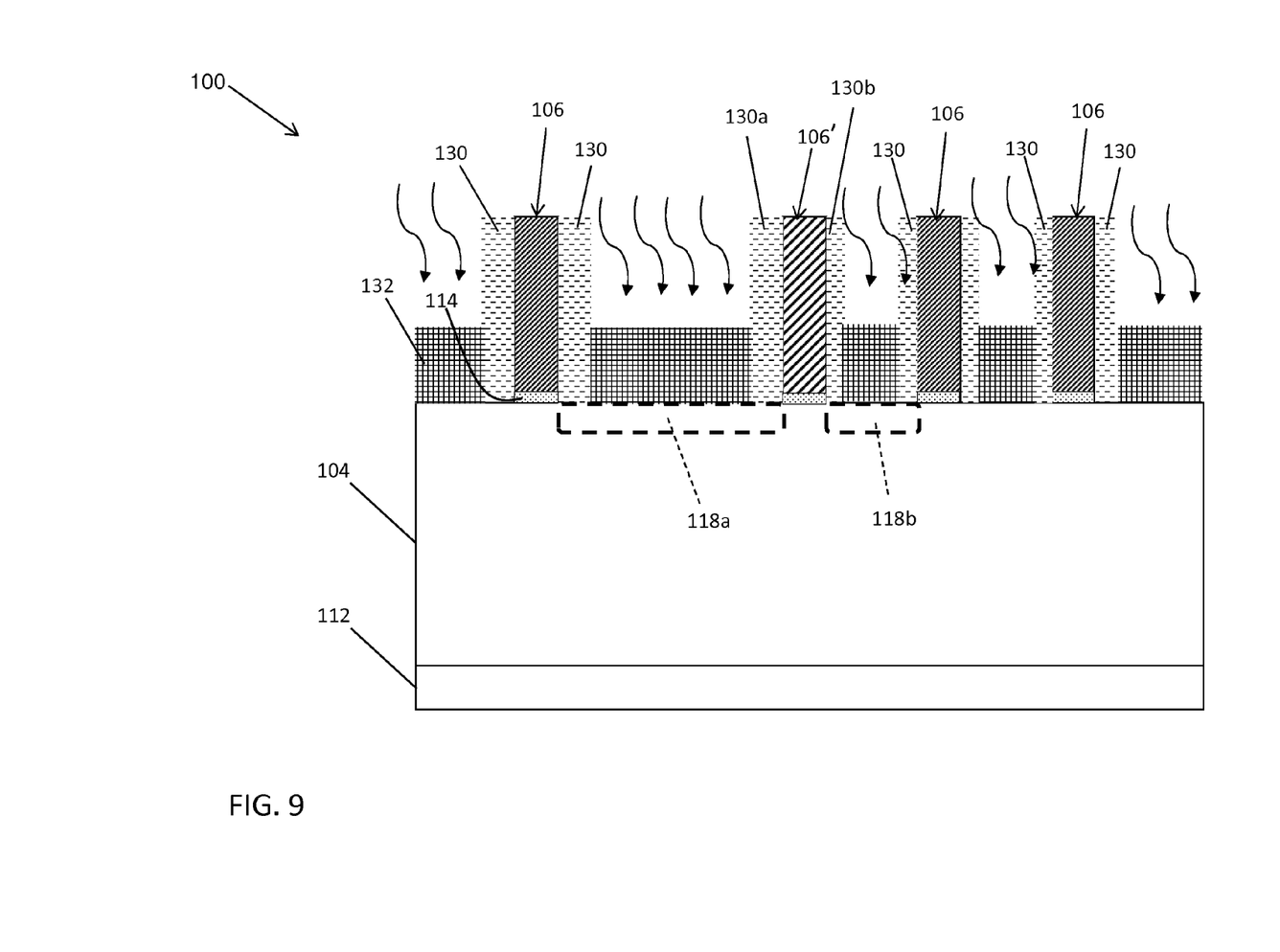
FIG. 9 illustrates the semiconductor device of FIG. 8 undergoing an anneal process to diffuse the dopants of the epitaxial semiconductor material into the semiconductor fin.

Referring to FIG. 9, the semiconductor device 100 is illustrated undergoing a high temperature anneal process. For a spike anneal process, the temperatures may range from approximately 800 Celsius (° C.) to approximately 1000° C. For a laser anneal process, the temperatures may range from approximately 800° C. to approximately 1200° C. The high temperatures drive (i.e., diffuse) the dopants from the epitaxial material 132 into the underlying semiconductor fin 104. In this manner, source/drain regions (not shown in FIG. 9) can be formed as understood by one of ordinary skill in the art.

Figure 10:
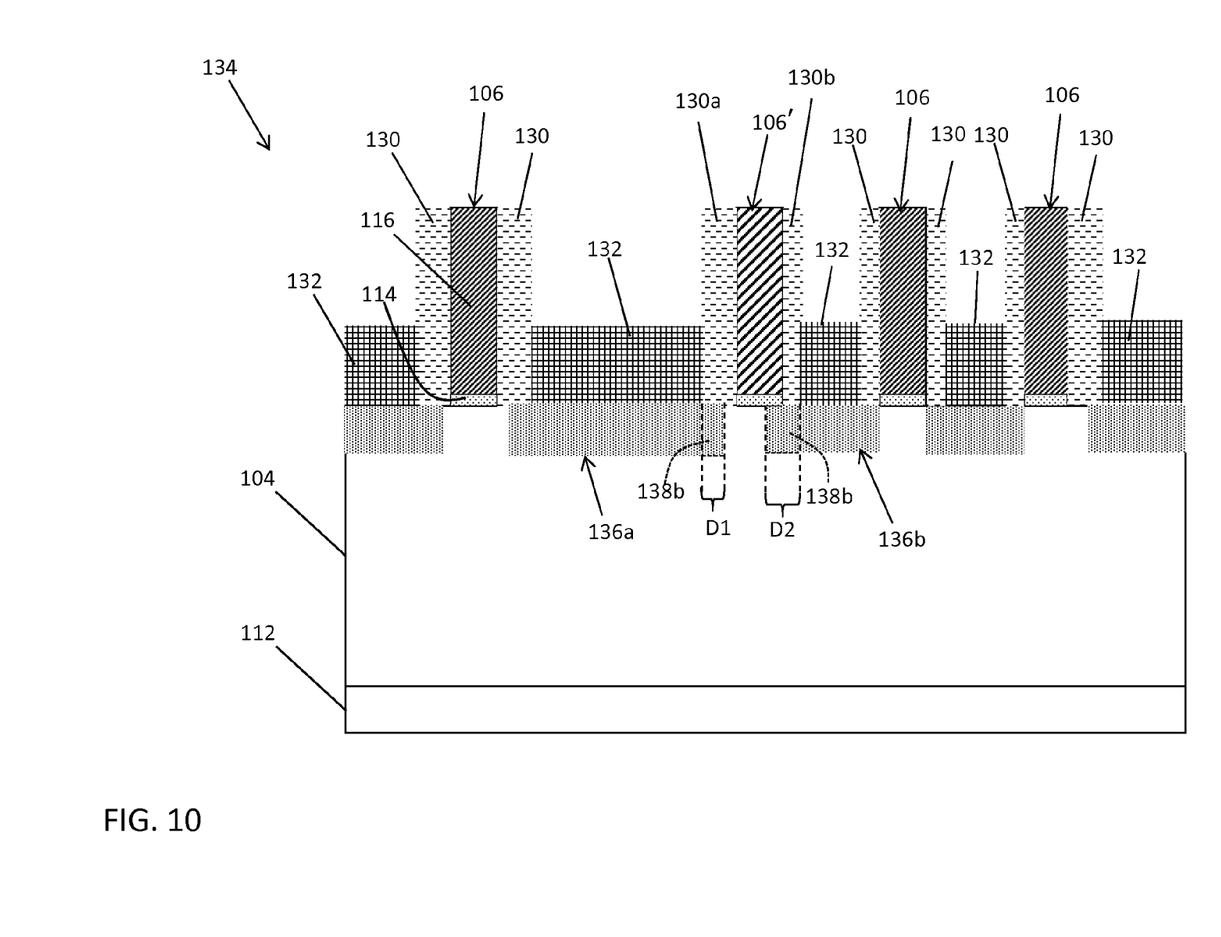
FIG. 10 illustrates the semiconductor device following the anneal process of FIG. 6 which results in an asymmetrical finFET including an overlapping drain region that extends beneath the desired gate structure.

Turning now to FIG. 10, a final asymmetrical finFET device 134 is illustrated according to a non-limiting embodiment. The asymmetrical finFET device 134 includes a pair of asymmetrical gate spacer 130a-130b and asymmetrical drain/source regions 136a-136b. The drain region 136a includes a drain extension region 138a, and the source region 136b includes a source extension region 138b. The thickness of the drain spacer 130a controls the dimensions of the drain extension region 138a, while the thickness of the source spacer 130b controls the dimensions of the source extension region 138b. That is the thicknesses of the gate spacers 130a-130b are utilized to independently control the dimensions of the drain extension region 138a and the source extension 138b with respect to one another.

More specifically, a drain spacer 130a is formed atop the drain region 136a and a source spacer 130b is formed atop the source region 136b. As discussed above, the drain spacer 130a has a first thickness ($T_1$) that is greater than a second thickness ($T_2$) of the source spacer gate 130b. The thicker drain spacer 130a inhibits the lateral diffusion (i.e., along the X-axis) in the fin 104, while the thin source spacer 130b allows the lateral diffusion of dopants in the fin 104. Accordingly, the drain extension region 138a extends laterally beneath the drain gate spacer 130a at a first distance ($D_1$), while the source extension region 138b extends laterally beneath the source spacer 130b at a second distance ($D_2$). It should be appreciated that the asymmetrical source/regions may include a combination of the source/drain regions 136a-136b and their respective extension regions 138a-138b. In addition, the asymmetrical drain and source regions 136a-136b are formed simultaneously, i.e., during a single processing step, whereas conventional fabrication processes require additional masks to block the source region when forming the drain or vice versa.

According to at least one embodiment shown in FIG. 10, the thick drain spacer 130a inhibits diffused dopants from extending beneath desired gate structure 106' so as to form an underlapped drain extension region 138a. The thin source spacer 130b, however, allows diffused dopants from extending beneath the desired gate structure 106' so as to form an overlapped extension region 138b. In this manner, the formation of an asymmetrical drain extension region 136a with respect to the source region 136b compensates for increased parasitic capacitance and/or parasitic resistance produced by the drain region 136a.

As described in detail above, at least one non-limiting embodiments provide a semiconductor fabrication process that utilizes a thicker spacer formed over a portion of the fin reserved for the drain region. In this manner, the drain region can be formed simultaneously with respect to the source region. That is, the drain region and the source region can be formed simultaneously during the same processing step. Unlike conventional fabrication methods, however, at least one embodiment achieves a variation in the drain region overlap with respect to the source region simultaneously without requiring additional masks and/or mask isolation steps. In this manner, a reduced scaled asymmetrical finFET device is provided having an adjusted a parasitic resistance and/or parasitic capacitance between drain region and the source region.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An asymmetrical finFET device, comprising:
   at least one semiconductor fin on an upper surface of a semiconductor substrate, the at least one fin extending along a length of the semiconductor substrate to define a fin length;
   a plurality of gate structures that wrap around the sidewalls and upper fin surface of the at least one semiconductor fin, the plurality of gate structures including at least one desired gate structure surrounded by at least one sacrificial gate structure;
   a first source/drain region of the semiconductor fin formed adjacent a first sidewall of the at least one desired gate structure, and a second source/drain region of the semiconductor fin formed adjacent a second sidewall of the at least one desired gate structure opposite the first sidewall,
   a pair of opposing asymmetrical spacers on respective sidewalls of the desired gate structure,
   wherein the pair of opposing asymmetrical spacers include a first gate spacer and a second gate spacer that are non-uniform with respect to one another to define a spacer thickness differential such that dimensions of the first and second source/drain regions are asymmetrical with respect to one another.

2. The asymmetrical finFET device of claim 1, wherein the first source/drain region includes a first extension region, and the second source/drain region includes a second extension region that is larger than the first extension region.

3. The asymmetrical finFET device of claim 2, further comprising a pair of opposing asymmetrical spacers on respective sidewalls of the desired gate structure, wherein the asymmetrical spacers including a the first gate spacer having a first thickness atop the first source/drain region and a the second gate spacer having a second thickness atop the second source/drain region, wherein the second thickness being less than the first thickness.

* * * * *